(12) United States Patent
Moon (10) Patent No.: US 11,688,434 B2
(45) Date of Patent: Jun. 27, 2023

(54) INTERNAL VOLTAGE GENERATION CIRCUIT AND SEMICONDUCTOR MEMORY APPARATUS INCLUDING THE SAME

(71) Applicant: SK hynix Inc., Gyeonggi-do (KR)

(72) Inventor: Young Jin Moon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/144,543

(22) Filed: Jan. 8, 2021

(65) Prior Publication Data
US 2022/0044711 A1 Feb. 10, 2022

(30) Foreign Application Priority Data

Aug. 5, 2020 (KR) .................. 10-2020-0097903

(51) Int. Cl.
*G11C 5/14* (2006.01)
(52) U.S. Cl.
CPC .................... *G11C 5/147* (2013.01)
(58) Field of Classification Search
CPC ...................................... G11C 5/147
USPC ........................................ 365/226
See application file for complete search history.

(56) References Cited

U.S. PATENT DOCUMENTS

| | | | | |
|---|---|---|---|---|
| 9,071,293 | B1* | 6/2015 | Venditti | H04B 1/0475 |
| 2009/0066410 | A1* | 3/2009 | Shin | G05F 1/56 |
| | | | | 327/543 |
| 2011/0241769 | A1* | 10/2011 | Jung | G05F 1/56 |
| | | | | 327/543 |
| 2017/0344041 | A1* | 11/2017 | Park | G11C 5/147 |
| 2018/0181511 | A1* | 6/2018 | Jung | G06F 13/4022 |
| 2020/0243155 | A1* | 7/2020 | Mohr | G11C 29/56008 |

FOREIGN PATENT DOCUMENTS

| KR | 10-2007-0034784 | 3/2007 |
|---|---|---|
| KR | 10-2012-0033439 | 4/2012 |

* cited by examiner

*Primary Examiner* — Huan Hoang
*Assistant Examiner* — Minh Dinh
(74) *Attorney, Agent, or Firm* — IP & T Group LLP (57) ABSTRACT

An internal voltage generation circuit may include: a voltage comparison circuit configured to generate a control voltage by comparing a reference voltage and an internal voltage which is fed back thereto; a voltage driving circuit configured to generate an internal voltage based on the control voltage; and a drivability control circuit configured to control the voltage level of the control voltage based on an enable signal which is activated during an active operation, in order to control drivability of the voltage driving circuit.

16 Claims, 5 Drawing Sheets

FIG. 5

INTERNAL VOLTAGE GENERATION CIRCUIT AND SEMICONDUCTOR MEMORY APPARATUS INCLUDING THE SAME

CROSS-REFERENCE TO RELATED APPLICATION

The present application claims priority under 35 U.S.C. § 119(a) to Korean application number 10-2020-0097903, filed on Aug. 5, 2020, in the Korean Intellectual Property Office, which is incorporated herein by reference in its entirety.

BACKGROUND

1. Technical Field

Various embodiments generally relate to an internal voltage generation circuit and a semiconductor memory apparatus including the same, and more particularly, to an internal voltage generation circuit for stably generating an internal voltage in an interval in which an internal voltage is used, and a semiconductor memory apparatus including the same.

2. Related Art

In general, an integrated circuit including a semiconductor apparatus and a semiconductor memory apparatus receives an external voltage, and generates an internal voltage to perform a circuit operation. Therefore, the integrated circuit has an internal voltage generation circuit mounted therein to generate the internal voltage. The internal voltage generated by the internal voltage generation circuit may be supplied to an internal circuit which needs the internal voltage. Therefore, when the internal voltage generation circuit is designed, it is important to provide a sufficient internal voltage to the internal circuit.

SUMMARY

Various embodiments are directed to an internal voltage generation circuit capable of increasing drivability of a control voltage during an active operation in which an internal voltage is used.

Also, various embodiments are directed to an internal voltage generation circuit capable of generating a stable internal voltage as the characteristic of a transistor is changed according to process, voltage, and temperature (PVT) skew.

In an embodiment, an internal voltage generation circuit comprising: a voltage comparison circuit configured to generate a control voltage by comparing a reference voltage with a feedback voltage which is fed back to the voltage comparison circuit; a voltage driving circuit configured to generate an internal voltage based on the control voltage, the internal voltage being used to generate the feedback voltage; and a drivability control circuit configured to control a voltage level of the control voltage based on an enable signal which is activated during an active operation, in order to control drivability of the voltage driving circuit.

In an embodiment, a semiconductor memory apparatus comprising: a voltage comparison circuit configured to generate a control voltage by comparing a reference voltage with a feedback voltage which is fed back to the voltage comparison circuit; a voltage driving circuit configured to generate an internal voltage based on the control voltage, the internal voltage being used to generate the feedback voltage; a drivability control circuit configured to control a voltage level of the control voltage based on an enable signal which is activated during an active operation, in order to control drivability of the voltage driving circuit; and a loading control circuit configured to adjust a resistance value reflected into the drivability control circuit based on data information inputted to or outputted from a memory cell array circuit which is driven by the internal voltage.

In an embodiment, a semiconductor memory apparatus comprising: a memory cell array configured to store data; and an internal voltage generation circuit including: a voltage comparison circuit configured to generate a control voltage by comparing a reference voltage with a feedback voltage; a voltage driving circuit configured to generate an internal voltage based on the control voltage and provide the internal voltage to the memory cell array, the internal voltage being fed back to the voltage comparison circuit as the feedback voltage; and a drivability control circuit configured to adjust a voltage level of the control voltage to control drivability of the voltage driving circuit based on at least one of process, voltage, temperature (PVT) skew and values in the data.

In accordance with embodiments, the internal voltage generation circuit can generate a stable internal voltage during an active operation, thereby providing stable circuit operation for an internal circuit which receives the internal voltage.

Furthermore, the internal voltage generation circuit can generate a stable internal voltage even though the characteristic of a transistor is changed, thereby raising the reliability of the internal voltage generation circuit.

Objects of the present disclosure are not limited to those mentioned herein; other objects not described will become apparent to those skilled in the art to which the present disclosure pertains from the following description.

DETAILED DESCRIPTION

The present description of the present disclosure provides structural and functional details directed to various embodiments. The scope of the invention, however, is not limited to or by any of the disclosed embodiments nor to any particular detail provided herein. That is, those skilled in the art will understand in view of the present disclosure that any embodiment may be modified in various ways and may have various forms. Accordingly, the invention encompasses all such variations that fall within the scope of the claims including their equivalents. Furthermore, a specific embodiment does not necessarily include all stated objects or effects nor include only such objects and effects. Accordingly, the scope of the invention is not limited thereby.

Throughout the specification, reference to "an embodiment" or the like is not necessarily to only one embodiment, and different references to any such phrase is not necessarily to the same embodiment(s). The term "embodiments" when used herein does not necessarily refer to all embodiments.

Terms, such as "first" and "second", are used to distinguish one element from another element that otherwise have the same or similar names. A first element in one instance may be named a second element in another instance without indicating any substantive change in the element itself.

The singular is intended to include the plural, unless clearly expressed otherwise or it is clear from the context that only one is intended. Open-ended terms such as "include" or "have" should be understood as indicating the existence of stated characteristics, numbers, steps, operations, elements, parts, or combination thereof, but not excluding the possibility that one or more other characteristics, numbers, steps, operations, elements, parts, or combination thereof are present or may be added.

In each of steps, symbols (e.g., a, b, and c) are used for convenience of a description, not necessarily to indicate any particular order of steps or operations. Consistent with the teachings herein, steps/operations may be performed in any suitable order, unless a specific order is clearly described or such order is indicated by the context. In some cases, two or more steps/operations may be performed substantially at the same time.

All the terms used herein, including technological or scientific terms, have the same meanings as typically understood by those skilled in the art, unless otherwise defined. Terms defined in commonly used dictionaries should be construed in the context of the related technology and should not be construed as ideal or in an excessively formal way, unless clearly defined in the application.

Figure 1:
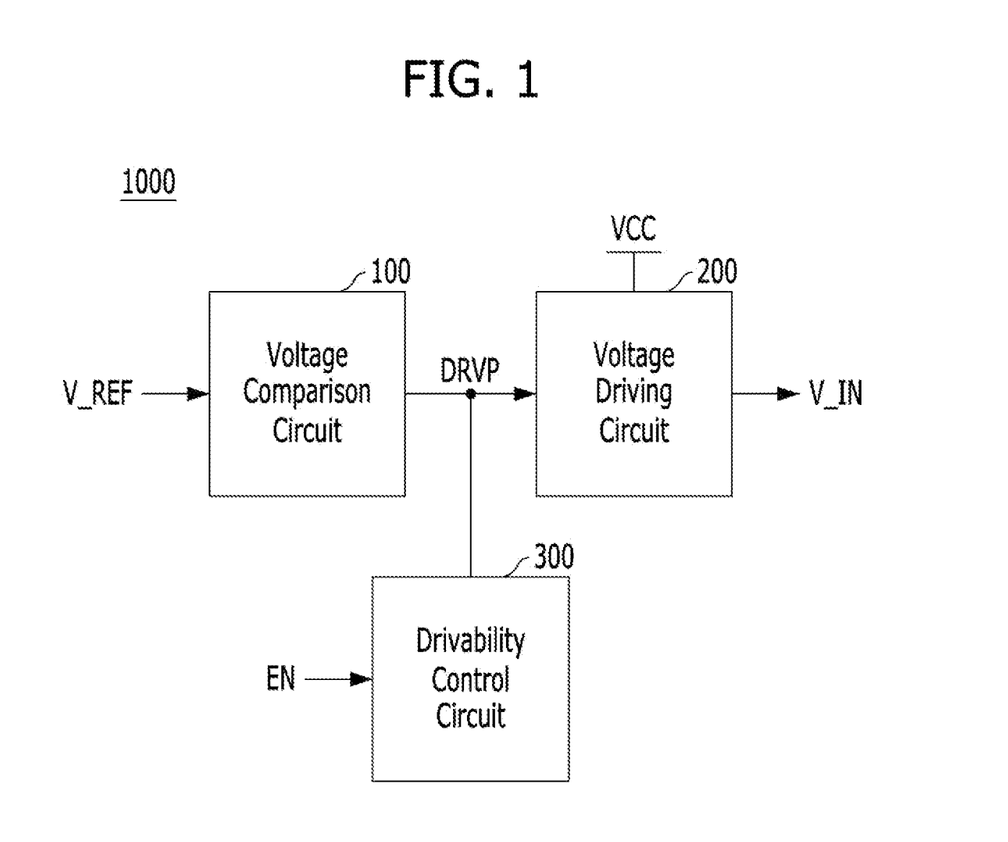
FIG. 1 is a block diagram illustrating a configuration of an internal voltage generation circuit in accordance with an embodiment.

FIG. 1 is a block diagram illustrating a configuration of an internal voltage generation circuit 1000 in accordance with an embodiment.

Referring to FIG. 1, the internal voltage generation circuit 1000 may be configured to generate an internal voltage V_IN based on a reference voltage V_REF. The internal voltage generation circuit 1000 may include a voltage comparison circuit 100, a voltage driving circuit 200 and a drivability control circuit 300.

The voltage comparison circuit 100 may be configured to generate a control voltage DRVP by comparing the reference voltage V_REF to a feedback voltage V_FD which is fed back to the voltage comparison circuit 100. When the voltage level of the internal voltage V_IN becomes less than or equal to a voltage level corresponding to the reference voltage V_REF, the voltage comparison circuit 100 may activate the control voltage DRVP. As described below with reference to FIG. 2, the voltage driving circuit 200 may generate the feedback voltage V_FD by dividing the internal voltage V_IN through, for example, a voltage divider (see FIG. 2), and provide the feedback voltage V_FD to the voltage comparison circuit 100. Thus, the feedback voltage V_FD may be or be derived from the internal voltage V_IN.

The voltage driving circuit 200 may be configured to generate the internal voltage V_IN based on the control voltage DRVP. The voltage driving circuit 200 may generate the internal voltage V_IN by using an external voltage, e.g., an external supply voltage, applied to a VCC terminal, when the control voltage DRVP is activated.

The drivability control circuit 300 may be configured to control the voltage level of the control voltage DRVP based on an enable signal EN which is activated during an active operation, in order to control the drivability of the voltage driving circuit 200. The drivability control circuit 300 may drive, i.e., charge, a node, from which the control voltage DRVP is outputted, to a set voltage level based on the enable signal EN. The active operation may indicate an operation in which the internal circuit uses the internal voltage V_IN. In an embodiment, the internal voltage generation circuit 1000 may generate the internal voltage V_IN even during a standby operation before the active operation.

The internal voltage generation circuit 1000 may generate the internal voltage V_IN during the standby operation and the active operation. In particular, the internal voltage generation circuit 1000 may drive the node, from which the control voltage DRVP is outputted, to a set voltage level based on the enable signal EN which is activated during the active operation. Therefore, the drivability of the voltage driving circuit 200 may be increased based on the control voltage DRVP whose voltage level is adjusted during the active operation.

Figure 2:
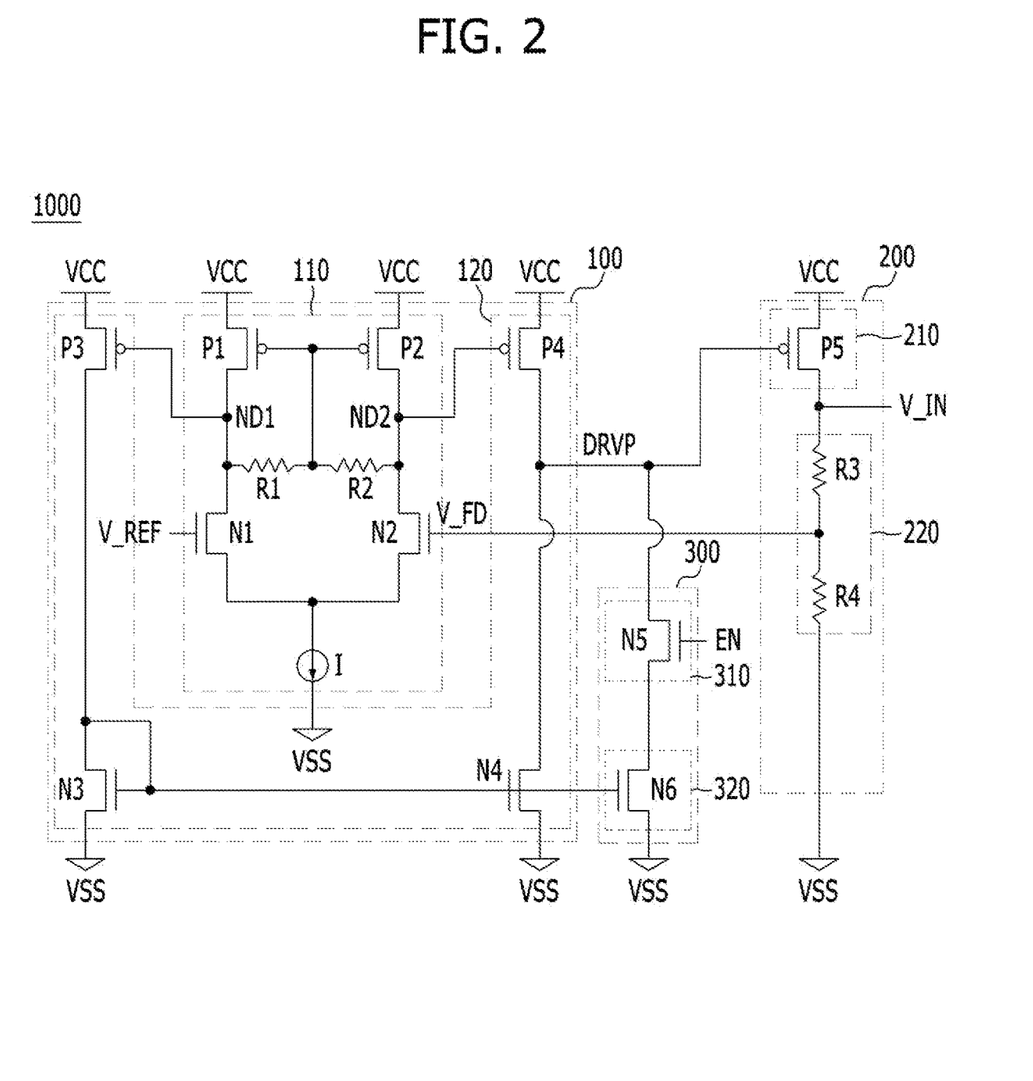
FIG. 2 is a circuit diagram illustrating a circuit configuration of an internal voltage generation circuit, such as that of FIG. 1.

FIG. 2 is a circuit diagram illustrating a circuit configuration of the internal voltage generation circuit 1000 of FIG. 1.

Referring to FIG. 2, the internal voltage generation circuit 1000 may include the voltage comparison circuit 100, the voltage driving circuit 200 and the drivability control circuit 300. The voltage comparison circuit 100 may include a comparison circuit 110 and a current mirroring circuit 120. The voltage driving circuit 200 may include a driving circuit 210 and a divider circuit 220. The drivability control circuit 300 may include a switching circuit 310 and a loading circuit 320.

The comparison circuit 110 of the voltage comparison circuit 100 may be configured to compare the reference voltage VREF to a feedback voltage V_FD corresponding to, or derived from via the divider circuit 200, the internal voltage V_IN. The comparison circuit 110 may include first and second PMOS transistors P1 and P2, first and second resistors R1 and R2, first and second NMOS transistors N1 and N2 and a current source I.

The first PMOS transistor P1 may be coupled between the external supply voltage terminal VCC and a first node ND1, and the second PMOS transistor P2 may be coupled between the external supply voltage terminal VCC and a second node ND2. The first and second resistors R1 and R2 may be coupled in series between the first and second nodes ND1 and ND2. The first and second resistors R1 and R2 may be configured to set turn-on levels of the first and second PMOS transistors P1 and P2. A common node of the first and second resistors R1 and R2 may be coupled to gates of the first and second PMOS transistors P1 and P2. One end of the current source I may be coupled to a ground supply voltage terminal VSS, and the other end of the current source I may be coupled to the first and second NMOS transistors N1 and N2. The first NMOS transistor N1 may be coupled between the first node ND1 and the current source I, and receive the reference voltage V_REF through a gate thereof. The second NMOS transistor N2 may be coupled between the second node ND2 and the current source I, and receive the feedback voltage V_FD through a gate thereof.

The current mirroring circuit 120 of the voltage comparison circuit 100 may be configured to generate the control voltage DRVP through a mirroring operation according to signals outputted from the first and second nodes ND1 and ND2 of the comparison circuit 110. The current mirroring circuit 120 may include third and fourth PMOS transistors P3 and P4 and third and fourth NMOS transistors N3 and N4.

The third PMOS transistor P3 and the third NMOS transistor N3 may be coupled in series between the external supply voltage terminal VCC and the ground supply voltage terminal VSS. The fourth PMOS transistor P4 and the fourth NMOS transistor N4 may be coupled in series between the external supply voltage terminal VCC and the ground supply voltage terminal VSS. The gate of the third PMOS transistor P3 may be coupled to the first node ND1, and the gate of the fourth PMOS transistor P4 may be coupled to the second node ND2. The drain and gate of the third NMOS transistor N3 and the gate of the fourth NMOS transistor N4 may be coupled in common to perform a current mirroring operation.

The driving circuit 210 of the voltage driving circuit 200 may be configured to drive the internal voltage V_IN based on the control voltage DRVP. The driving circuit 210 may include a fifth PMOS transistor P5 coupled between the external supply voltage terminal VCC and an output terminal from which the internal voltage V_IN is outputted, and configured to receive the control voltage DRVP through a gate thereof.

The divider circuit 220 of the voltage driving circuit 200 may be configured to generate the feedback voltage V_FD by dividing the internal voltage V_IN according to the resistance values of third and fourth resistors R3 and R4 of the divider circuit 220. R3 and R4 may be coupled in series between the ground supply voltage terminal VSS and the output terminal from which the internal voltage V_IN is outputted. The third and fourth resistors R3 and R4 may be coupled to the common node from which the feedback voltage V_FD is outputted.

The switching circuit 310 of the drivability control circuit 300 may be configured to perform a switching operation based on the enable signal EN. The switching circuit 310 may include a fifth NMOS transistor N5 coupled to the output terminal from which the control voltage DRVP is outputted, and configured to receive the enable signal EN through a gate thereof.

The loading circuit 320 of the drivability control circuit 300 may be configured to reflect a resistance value in the switching circuit 310. The loading circuit 320 may include a sixth NMOS transistor N6 coupled between the switching circuit 310 and the ground supply voltage terminal VSS, and coupled to the gates of the third and fourth NMOS transistors N3 and N4 in common.

Hereafter, the circuit operation of the internal voltage generation circuit 1000 is described.

During the standby operation, the voltage level of the feedback voltage V_FD may be less than the voltage level of the reference voltage V_REF. Thus, the first NMOS transistor N1 may be turned on based on the voltage level of the reference voltage V_REF, which is greater than the voltage level of the feedback voltage V_FD. As the first NMOS transistor N1 is turned on, the voltage level of the first node ND1 may be lowered, and the third PMOS transistor P3 may be turned on. Thus, the third and fourth NMOS transistors N3 and N4 may be turned on. The voltage level of the control voltage DRVP may be lowered through the current mirroring operation. Therefore, the fifth PMOS transistor P5 serving as the driving circuit 210 of the voltage driving circuit 200 may cause transfer of power, applied to the external supply voltage terminal VCC, as the internal voltage V_IN, which corresponds to the voltage level of the control voltage DRVP.

Then, the voltage level of the feedback voltage V_FD may become higher than the voltage level of the reference voltage V_REF. Thus, the second NMOS transistor N2 may be turned on based on the voltage level of the feedback voltage V_FD, which is higher than the voltage level of the reference voltage V_REF. As the second NMOS transistor N2 is turned on, the voltage level of the second node ND2 may be lowered, and the voltage level of the control voltage DRVP may be increased. Therefore, the fifth PMOS transistor P5 of the voltage driving circuit 200 may cause transfer of power, applied to the external supply voltage terminal VCC, as the internal voltage V_IN, which corresponds to the voltage level of the control voltage DRVP.

As described above, the internal voltage generation circuit 1000 may generate and retain the internal voltage V_IN corresponding to the reference voltage V_REF during the standby operation. Hereafter, the active operation of the internal voltage generation circuit 1000 is described.

During the active operation, the enable signal EN may be activated from logic 'low' to logic 'high'. Therefore, the fifth NMOS transistor N5 serving as the switching circuit 310 of the drivability control circuit 300 may be turned on. The loading circuit 320 may have a resistance value corresponding to a voltage level applied to a gate thereof. Therefore, the drivability control circuit 300 may discharge the output terminal of the voltage comparison circuit 100 to the ground supply voltage terminal VSS based on the enable signal EN. That is, the control voltage DRVP may be pulled down based on the enable signal EN. Then, the fifth PMOS transistor P5 may be turned on based on the pulled-down control voltage DRVP. Therefore, as the internal voltage V_IN is applied to the external supply voltage terminal VCC during the active operation, a sufficient amount of power may be provided. When a sufficient amount of power is provided as the internal voltage V_IN is applied to the external supply voltage terminal VCC during the active operation, it may indicate that the internal circuit which receives the internal voltage V_IN may secure a sufficient amount of power and perform a stable operation during the active operation.

The internal voltage generation circuit 100 may adjust the voltage level of the control voltage DRVP by discharging the control voltage DRVP based on the enable signal EN. Therefore, the internal voltage V_IN which is generated based on the control voltage DRVP may secure a sufficient amount of power during the active operation.

Figure 3:
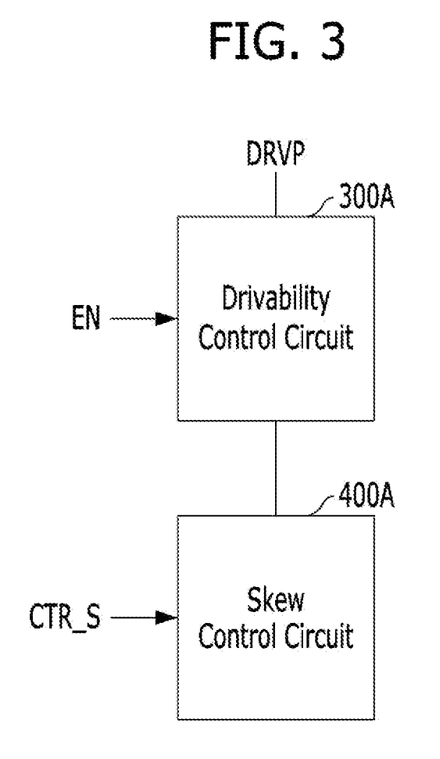
FIG. 3 is a block diagram illustrating a partial configuration of a variation of the internal voltage generation circuit of FIG. 2 in accordance with an embodiment.

FIG. 3 is a block diagram illustrating a partial configuration of a variation of the internal voltage generation circuit in FIG. 2 in accordance with an embodiment.

Referring to FIG. 3, the internal voltage generation circuit may include a drivability control circuit 300A. The drivability control circuit 300A may represent a variation of the drivability control circuit 300 in FIGS. 1 and 2. Further, the internal voltage generation circuit may include a skew control circuit 400A.

The drivability control circuit 300A may be configured to control the voltage level of the control voltage DRVP based on the enable signal EN which is activated during the active operation. The skew control circuit 400A may be configured to adjust a resistance value, which is reflected in the drivability control circuit 300A, based on a skew control signal CTR_S.

The characteristics of transistors which are configured in an integrated circuit including a semiconductor apparatus and a semiconductor memory apparatus may be changed according to process, voltage, temperature (PVT) skew. Therefore, the internal voltage generation circuit in accordance with an embodiment may generate a stable internal voltage V_IN by adjusting the drivability of the control voltage DRVP according to PVT skew.

Figure 4:
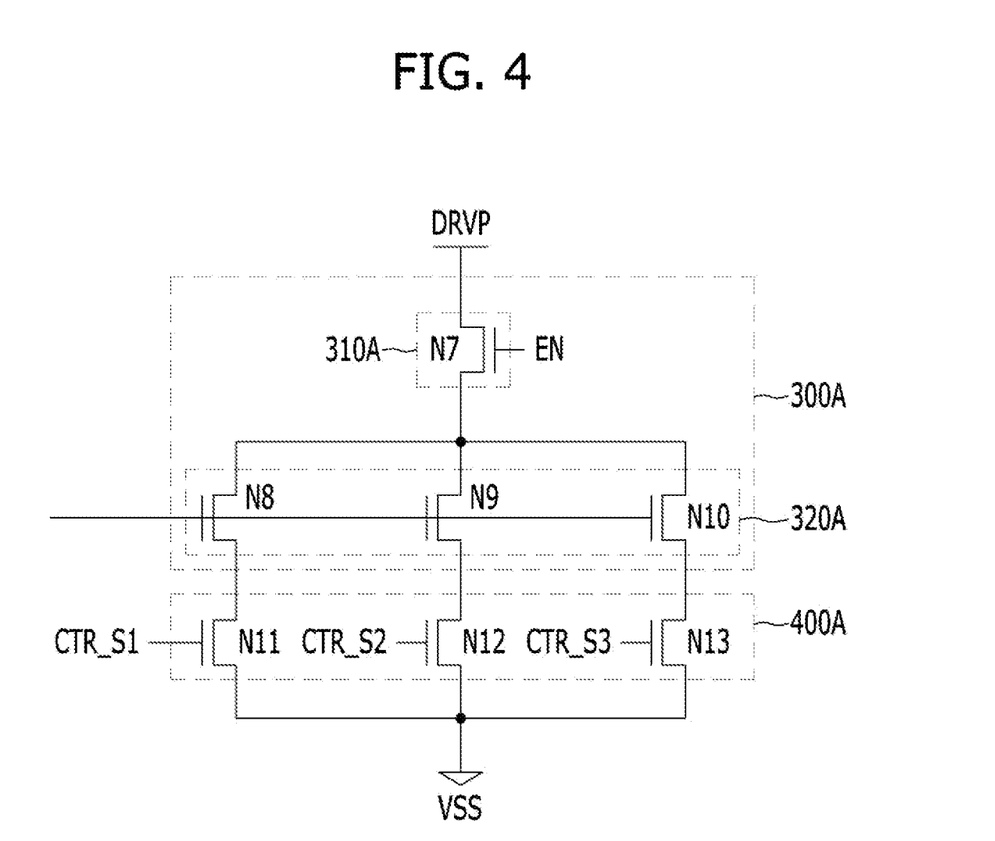
FIG. 4 is a circuit diagram illustrating circuit configurations of a drivability control circuit and a skew control circuit, such as those of FIG. 3.

FIG. 4 is a circuit diagram illustrating circuit configurations of the drivability control circuit 300A and the skew control circuit 400A of FIG. 3.

Referring to FIG. 4, the drivability control circuit 300A may include a switching circuit 310A and a loading circuit 320A.

The switching circuit 310A may be configured to perform a switching operation based on the enable signal EN. The switching circuit 310A may include a seventh NMOS transistor N7 coupled to a node from which the control voltage DRVP is outputted, and be configured to receive the enable signal EN through a gate thereof.

The loading circuit 320A may be configured to reflect a resistance value into the switching circuit 310A. The loading circuit 320A may include eighth to tenth NMOS transistors N8 to N10 in parallel coupled to the switching circuit 310A, and coupled to the gates of the third and fourth NMOS transistors N3 and N4 of FIG. 2 in common. The eighth to tenth NMOS transistors N8 to N10 may have different turn-on resistance values. As described below, the eighth to tenth NMOS transistors N8 to N10 may be selectively enabled based on first to third screw control signals CTR_S1 to CTR_S3 included in the skew control signal CTR_S. Each of the first to third screw control signals CTR_S1 to CTR_S3 may have a logic level which is set according to PVT skew 'SLOW', 'TYPICAL' or 'FAST'.

The skew control circuit 400A may be configured to adjust a resistance value which is reflected in the drivability control circuit 300A, based on the first to third screw control signals CTR_S1 to CTR_S3. The skew control circuit 400A may include 11th to 13th NMOS transistors N11 to N13.

The 11th NMOS transistor N11 may be coupled between the eighth NMOS transistor N8 and the ground supply voltage terminal VSS, and receive the first skew control signal CTR_S1 through a gate of N11. The 12th NMOS transistor N12 may be coupled between the ninth NMOS transistor N9 and the ground supply voltage terminal VSS, and receive the second skew control signal CTR_S2 through a gate of N12. The 13th NMOS transistor N13 may be coupled between the tenth NMOS transistor N10 and the ground supply voltage terminal VSS, and receive the third skew control signal CTR_S3 through a gate of N13.

Therefore, the 11th NMOS transistor N11 may be turned on based on the first skew control signal CTR_S1, the 12th NMOS transistor N12 may be turned on based on the second skew control signal CTR_S2, and the 13th NMOS transistor N13 may be turned on based on the third skew control signal CTR_S3. When the 11th NMOS transistor N11 is turned on, the resistance value of the eighth NMOS transistor N8 may be reflected in the drivability control circuit 300A. When the 12th NMOS transistor N12 is turned on, the resistance value of the ninth NMOS transistor N9 may be reflected in the drivability control circuit 300A. When the 13th NMOS transistor N13 is turned on, the resistance value of the tenth NMOS transistor N10 may be reflected in the drivability control circuit 300A.

One or more of the first to third skew control signals CTR_S1 to CTR_S3 inputted to the skew control circuit 400A may be activated according to PVT skew. In other words, when the characteristic of each of the transistors is determined to be any one of 'SLOW', 'TYPICAL' and 'FAST', one or more of the first to third skew control signals CTR_S1 to CTR_S3 may be activated. One or more NMOS transistors of the 11th to 13th NMOS transistors N11 to N13 of the skew control circuit 400A may be turned on based on the activated skew control signal. Therefore, the resistance value(s) of one or more NMOS transistors of the eighth to tenth NMOS transistors N8 to N10 of the loading circuit 320A may be reflected in the drivability control circuit 300A. That is, the skew control circuit 400A may adjust a resistance value which is reflected in the drivability control circuit 300A, based on the first to third skew control signals CTR_S1 to CTR_S3 according to PVT skew. In an embodiment, the resistance value which is reflected in the drivability control circuit 300A when PVT skew is 'FAST' may be greater than the resistance value which is reflected in the drivability control circuit 300A when PVT skew is 'SLOW'.

The internal voltage generation circuit 1000 may adjust the resistance value which is reflected in the drivability control circuit 300A according to PVT skew. Therefore, the internal voltage generation circuit 1000 may generate the stable internal voltage V_IN corresponding to PVT skew.

Figure 5:
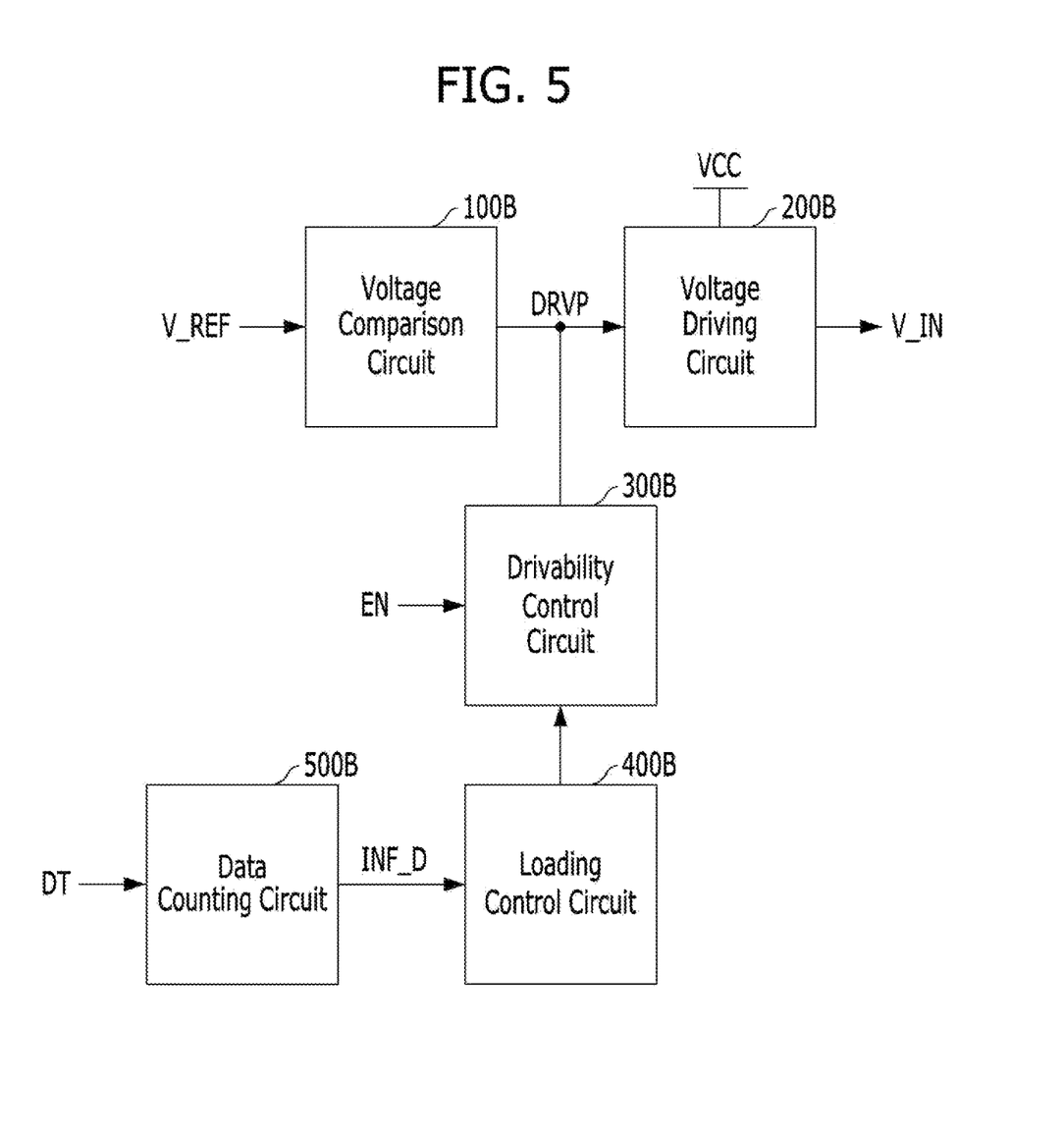
FIG. 5 is a block circuit illustrating a configuration of a semiconductor memory apparatus in accordance with an embodiment.

FIG. 5 is a block diagram illustrating a configuration of a semiconductor memory apparatus in accordance with an embodiment.

The semiconductor memory apparatus may include a memory cell array circuit (not illustrated). The memory cell array circuit may store data inputted from an external source, and output the stored data to an external destination. The data inputted to/outputted from the memory cell array circuit may be '1' or '0', for example. Hereafter, by way of example, the consumption or use of the internal voltage V_IN during an input/output operation for data corresponding to '1' is greater than the consumption or use of the internal voltage V_IN during an input/output operation for data corresponding to '0'. Therefore, when the consumption of the internal voltage V_IN is high, power supplied as the internal voltage may be increased to stably generate the internal voltage V_IN. On the other hand, when the consumption of the internal voltage V_IN is low, power supplied as the internal voltage V_IN may be decreased to reduce unnecessary power generation.

Referring to FIG. 5, the semiconductor memory apparatus may include a voltage comparison circuit 100B, a voltage driving circuit 200B, a drivability control circuit 300B, a loading control circuit 400B and a data counting circuit 500B. Since the voltage comparison circuit 100B, the voltage driving circuit 200B and the drivability control circuit 300B of FIG. 5 correspond to the voltage comparison circuit 100 and the voltage driving circuit 200 of FIG. 1 and the drivability control circuit 300A of FIG. 3, respectively, detailed description thereof is omitted here.

The loading control circuit 400B may be configured to adjust a resistance value which is reflected in the drivability control circuit 300B, based on data information INF_D inputted to/outputted from the memory cell array circuit. The data information INF_D may be obtained by counting the values of data, e.g., the 0's and/or 1's, inputted to/outputted from the memory cell array circuit. That is, the data information INF_D may include information on the number of 1's, for example.

The loading control circuit 400B may be implemented in a similar manner to the skew control circuit 400A of FIG. 4. The data information INF_D may indicate, for example, that the number of data corresponding to '1' is high, the number of data corresponding to '1' is normal, and the number of data corresponding to '1' is low. Thus, the data information INF_D may include any of three pieces of first to third data information. First data information indicates that the number of 1's is high, second data information indicates that the number of 1's is normal, and third data indicates that the number of 1's is low. The loading control circuit 400B may include 11th to 13th NMOS transistors N11 to N13 like the skew control circuit 400A of FIG. 4. The 11th NMOS transistor N11 may receive first data information (not illustrated) as the data information INF_D through a gate thereof, the 12th NMOS transistor N12 may receive second data information (not illustrated) as the data information INF_D through a gate thereof, and the 13th NMOS transistor N13 may receive third data information (not illustrated) as the data information INF_D through a gate thereof.

In other words, one or more of the 11th to 13th NMOS transistors N11 to N13 of the loading control circuit 400B may be turned on based on the first to third data information serving as the data information INF_D. As already described with reference to FIG. 4, when one or more NMOS transistors of the 11th to 13th NMOS transistors N11 to N13 are turned on, a resistance value reflected in the drivability control circuit 300B may be adjusted.

That is, the semiconductor memory apparatus may adjust a resistance value reflected in the drivability control circuit 300B, based on the first to third data information. Therefore, the semiconductor memory apparatus may generate the stable internal voltage V_IN corresponding to input/output data.

The semiconductor memory apparatus may further include a data counting circuit 500B configured to generate the data information INF_D by counting data values DT of data, i.e., number of 0's and/or 1's, inputted to/outputted from the memory cell array circuit.

The counting circuit 500B may generate the data information INF_D by counting the number of data corresponding to '1', for example, among the data values DT of the data inputted to/outputted from the memory cell array circuit. Therefore, the data information INF_D may have information on whether the number of data corresponding to '1' among the data values DT of the data inputted to/outputted from the memory cell array circuit is high, normal or low.

The semiconductor memory apparatus may generate the data information INF_D by counting the data values DT of the data inputted to/outputted from the memory cell array circuit. The semiconductor memory apparatus may control the voltage level of the control voltage DRVP based on the data information INF_D during the active operation. Then, the semiconductor memory apparatus may generate the stable internal voltage V_IN based on the control voltage DRVP.

The data information INF_D may be obtained by counting the number of times that the value of previous data stored in the memory cell array circuit is different from the value of current data inputted to the memory cell array circuit. That is, the data information INF_D may include information obtained by counting the number of times that the value of the previous data stored in the memory cell array circuit is '1' and the value of the current data inputted to the memory cell array circuit is '0' or the number of time that the value of the previous data stored in the memory cell array circuit is '0' and the value of the current data inputted to the memory cell array circuit is '1'.

When the value of the previous data stored in the memory cell array circuit is different from the value of the current data inputted to the memory cell array circuit, that may indicate higher consumption or use of the internal voltage V_IN. Therefore, the semiconductor memory apparatus may generate the data information INF_D by counting the number of times that the value of the previous data stored in the memory cell array circuit is different from the value of the current data inputted to the memory cell array circuit, based on the data values DT of the data inputted to/outputted from the memory cell array circuit. The semiconductor memory apparatus may control the voltage level of the control voltage DRVP based on the data information INF_D during the active operation. Then, the semiconductor memory apparatus may generate the stable internal voltage V_IN based on the control voltage DRVP.

While various embodiments have been described above, it will be understood to those skilled in the art that the embodiments described are examples only. Accordingly, the present invention is not limited by or to any of the described embodiments.

Effects of the present disclosure are not limited to those described herein; other effects not described above will be understood by those skilled in the art to which the present disclosure pertains from the above description.

Although various embodiments have been illustrated and described, it will be apparent to those skilled in the art that various changes and modifications may be made without departing from the spirit and scope of the invention as defined in the following claims.

What is claimed is:

1. An internal voltage generation circuit comprising:
   a voltage comparison circuit configured to generate a control voltage by comparing a reference voltage with a feedback voltage which is fed back to the voltage comparison circuit;
   a voltage driving circuit configured to generate an internal voltage in response to the control voltage, the internal voltage being used to generate the feedback voltage; and
   a drivability control circuit directly connected to a node, from which the control voltage is outputted, and configured to be turned on in response to an activation of an enable signal which is activated during an active operation and pull-down a voltage level of the control voltage in response to the activation of the enable signal, and a loading control circuit connected in series with the drivability control circuit, and configured to adjust a resistance value reflected into the drivability control circuit in response to data information inputted to a gate of the loading control circuit.

2. The internal voltage generation circuit according to claim 1, wherein the drivability control circuit charges a node, from which the control voltage is outputted, to a set voltage level in response to the enable signal.

3. The internal voltage generation circuit according to claim 1, wherein the voltage comparison circuit comprises:
   a comparison circuit configured to compare the reference voltage with the feedback voltage; and
   a current mirroring circuit configured to generate the control voltage through a current mirroring operation according to an output signal of the comparison circuit.

4. The internal voltage generation circuit according to claim 1, wherein the drivability control circuit discharges an output terminal of the voltage comparison circuit in response to the activation of the enable signal.

5. The internal voltage generation circuit according to claim 1, wherein the drivability control circuit comprises:
   a switching circuit configured to perform a switching operation in response to the enable signal.

6. The internal voltage generation circuit according to claim 5, further comprising a skew control circuit configured to adjust a resistance value reflected in the drivability control circuit in response to a skew control signal.

7. The internal voltage generation circuit according to claim 6, wherein the loading circuit comprises a plurality of resistors having different resistance values, wherein each of the plurality of resistors is selectively enabled in response to the skew control signal.

8. The internal voltage generation circuit according to claim 1, wherein the drivability control circuit is configured to pull-down the voltage level of the control voltage to a ground supply voltage level to stabilize the internal voltage.

9. A semiconductor memory apparatus comprising:
a voltage comparison circuit configured to generate a control voltage by comparing a reference voltage with a feedback voltage which is fed back to the voltage comparison circuit;
a voltage driving circuit configured to generate an internal voltage in response to the control voltage, the internal voltage being used to generate the feedback voltage;
a drivability control circuit directly connected to a node, from which the control voltage is outputted, and configured to be turned on in response to an activation of an enable signal which is activated during an active operation and pull-down a voltage level of the control voltage in response to the activation of the enable signal; and
a loading control circuit connected in series with the drivability control circuit, and configured to adjust a resistance value reflected into the drivability control circuit in response to data information inputted to or outputted from a memory cell array circuit which is driven by the internal voltage, the data information inputted to a gate of the loading control circuit.

10. The semiconductor memory apparatus according to claim 9, further comprising a data counting circuit configured to generate the data information by counting data values of data inputted to or outputted from the memory cell array circuit.

11. The semiconductor memory apparatus according to claim 9, further comprising a data counting circuit configured to generate the data information by counting the number of times that the value of previous data stored in the memory cell array circuit is different from the value of current data inputted to the memory cell array circuit.

12. The semiconductor memory apparatus according to claim 9, wherein the drivability control circuit charges a node, from which the control voltage is outputted, to a set voltage level in response to the enable signal.

13. The semiconductor memory apparatus according to claim 9, wherein the drivability control circuit comprises:
a switching circuit configured to perform a switching operation in response to the enable signal; and
a loading circuit configured to reflect a resistance value in the switching circuit.

14. The semiconductor memory apparatus according to claim 13, wherein the loading circuit comprises a plurality of resistors having different resistance values,
wherein the loading control circuit selectively enables one or more resistors of the plurality of resistors in response to the data information.

15. The semiconductor memory apparatus according to claim 9, wherein the drivability control circuit is configured to pull-down the voltage level of the control voltage to a ground supply voltage level to stabilize the internal voltage.

16. A semiconductor memory apparatus comprising:
a memory cell array configured to store data; and
an internal voltage generation circuit including:
a voltage comparison circuit configured to generate a control voltage by comparing a reference voltage with a feedback voltage;
a voltage driving circuit configured to generate an internal voltage in response to the control voltage and provide the internal voltage to the memory cell array, the internal voltage being fed back to the voltage comparison circuit as the feedback voltage;
a drivability control circuit directly connected to a node, from which the control voltage is outputted, and configured to adjust a voltage level of the control voltage to control drivability of the voltage driving circuit in response to at least one of process, voltage, temperature (PVT) skew and values in the data;
a loading control circuit configured to adjust a resistance value reflected into the drivability control circuit in response to data information inputted to or outputted from the memory cell array which is driven by the internal voltage; and
a data counting circuit configured to generate the data information by counting the number of times that the value of previous data stored in the memory cell array is different from the value of current data inputted to the memory cell array.

* * * * *